(12) United States Patent
Chen

(10) Patent No.: US 11,143,702 B2
(45) Date of Patent: Oct. 12, 2021

(54) TEST ACCESS PORT CIRCUIT CAPABLE OF INCREASING TRANSMISSION THROUGHPUT

(71) Applicant: Realtek Semiconductor Corp., HsinChu (TW)

(72) Inventor: Yuefeng Chen, Suzhou (CN)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/000,351

(22) Filed: Aug. 23, 2020

(65) Prior Publication Data

US 2021/0063485 A1 Mar. 4, 2021

(30) Foreign Application Priority Data

Sep. 2, 2019 (CN) .......................... 201910821563.X

(51) Int. Cl.
*G01R 31/317* (2006.01)
*G01R 31/3185* (2006.01)
*G01R 31/3177* (2006.01)
*G01R 31/28* (2006.01)

(52) U.S. Cl.
CPC ... *G01R 31/31724* (2013.01); *G01R 31/2815* (2013.01); *G01R 31/3177* (2013.01); *G01R 31/31713* (2013.01); *G01R 31/318533* (2013.01); *G01R 31/318555* (2013.01); *G01R 31/318572* (2013.01)

(58) Field of Classification Search
CPC ........ G01R 31/31724; G01R 31/31713; G01R 31/3177; G01R 31/318555; G01R 31/318572; G01R 31/2815; G01R 31/318533

USPC .......................... 714/724, 727, 726, 729, 733
See application file for complete search history.

(56) References Cited

U.S. PATENT DOCUMENTS

| | | | |
|---|---|---|---|
| 5,254,942 A * | 10/1993 | D'Souza .......... | G01R 31/31858 324/73.1 |
| 6,125,464 A * | 9/2000 | Jin .................. | G01R 31/318572 714/724 |
| 7,417,450 B2 * | 8/2008 | Whetsei .......... | G01R 31/318577 324/750.3 |
| 7,949,919 B2 * | 5/2011 | Wu ................. | G01R 31/318572 714/727 |
| 8,667,355 B2 | 3/2014 | Whetsel | |
| 9,494,643 B2 | 11/2016 | Whetsel | |
| 9,588,178 B2 | 3/2017 | Whetsel | |
| 9,772,376 B1 | 9/2017 | Kawoosa | |
| 10,162,003 B2 | 12/2018 | Whetsel | |

(Continued)

*Primary Examiner* — John J Tabone, Jr.
(74) *Attorney, Agent, or Firm* — Winston Hsu

(57) ABSTRACT

A test access port circuit includes a data input terminal, a reset terminal, a mode selection terminal, at least one test data register set, an auxiliary data register set, an instruction register set, and a controller. The controller is coupled to the mode selection terminal and the instruction register set, and controls the at least one test data register set, the auxiliary data register set, and the instruction register set according to at least mode selection signal received by the mode selection terminal. In a reset terminal input mode, when the controller controls a test data register set of the at least one test data register set to store a first input data bit received by the data input terminal, the auxiliary data register set stores a second input data bit received by the reset terminal.

20 Claims, 4 Drawing Sheets

(56) References Cited

U.S. PATENT DOCUMENTS

| | | | |
|---|---|---|---|
| 2002/0184562 A1* | 12/2002 | Nadeau-Dostie | G01R 31/318555 714/30 |
| 2006/0156099 A1* | 7/2006 | Sweet | G06F 11/267 714/724 |
| 2009/0235136 A1* | 9/2009 | Whetsei | G01R 31/31723 714/727 |
| 2014/0082442 A1* | 3/2014 | Whetsei | G01R 31/31723 714/727 |
| 2016/0187421 A1* | 6/2016 | Oshiyama | G01R 31/31727 714/729 |
| 2019/0064266 A1* | 2/2019 | Whetsei | G01R 31/31727 |
| 2019/0146033 A1* | 5/2019 | Whetsei | G01R 31/318536 714/727 |

* cited by examiner

TEST ACCESS PORT CIRCUIT CAPABLE OF INCREASING TRANSMISSION THROUGHPUT

BACKGROUND OF THE INVENTION

1. Field of the Invention

The present invention is related to a test access port (TAP) circuit, and more particularly to a TAP circuit capable of increasing transmission throughput.

2. Description of the Prior Art

In the prior art, the joint test action group (JTAG) transmits information in a serial manner. The interface of the joint test action group mainly includes a data input terminal, a data output terminal, a reset terminal, a clock signal terminal, and a mode selection terminal. Generally, to transmit test data through the interface of the joint test action group, the system has to install a test access port (TAP) circuit on the device to be tested, and the test access port can control the internal registers and capture or output the data of the device for testing or debugging through the interface specified by the joint test action group.

Since the test access circuit outputs data through the data output terminal in a serial manner and receives data through the data input terminal in a serial manner, only one bit of data can be outputted or inputted at a time. Therefore, the transmission rate is very low. In prior art, to increase the speed of the data transmission in the system, it must be realized through other interfaces. That is, additional hardware is required, and the flexibility of the test system is very limited.

SUMMARY OF THE INVENTION

One embodiment of the present invention discloses a test access port circuit. The test access port circuit includes a data input terminal, a reset terminal, a mode selection terminal, at least one test data register set, a first auxiliary data register set, an instruction register set, and a controller.

The controller is coupled to the mode selection terminal and the instruction register set, and controls the at least one test data register set, the first auxiliary data register set, and the instruction register set according to at least mode selection signal received by the mode selection terminal.

In a reset terminal input mode, when the controller controls a first test data register set of the at least one test data register set to store a first input data bit received by the data input terminal, the first auxiliary data register set stores a second input data bit received by the reset terminal.

Another embodiment of the present invention discloses a test access port circuit. The test access port circuit includes a data input terminal, a data output terminal, a reset terminal, a mode selection terminal, at least one test data register set, a first auxiliary data register set, an instruction register set, and a controller.

The controller is coupled to the mode selection terminal and the instruction register set, and controls the at least one test data register set, the first auxiliary data register set, and the instruction register set according to at least mode selection signal received by the mode selection terminal.

In a data input terminal input mode, the controller controls a first test data register set of the at least one test data register set to receive a first input data bit through the data input terminal. In a data input terminal output mode, when the controller controls the first test data register set of the at least one test data register set to output a first output data bit through the data output terminal, the first auxiliary data register set outputs a second output data bit through the data input terminal.

Another embodiment of the present invention discloses a test access port circuit. The test access port circuit includes a data input terminal, a data output terminal, a reset terminal, a mode selection terminal, at least one test data register set, a first auxiliary data register set, an instruction register set, and a controller.

The controller is coupled to the mode selection terminal and the instruction register set, and controls the at least one test data register set, the first auxiliary data register set, and the instruction register set according to at least mode selection signal received by the mode selection terminal.

In a data output terminal output mode, the controller controls a first test data register set of the at least one test data register set to output a first output data bit through the data output terminal. In a data output terminal input mode, when the controller controls the first test data register set to receive a first input data bit through the data input terminal, the first auxiliary data register set receives a second input data bit through the data output terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
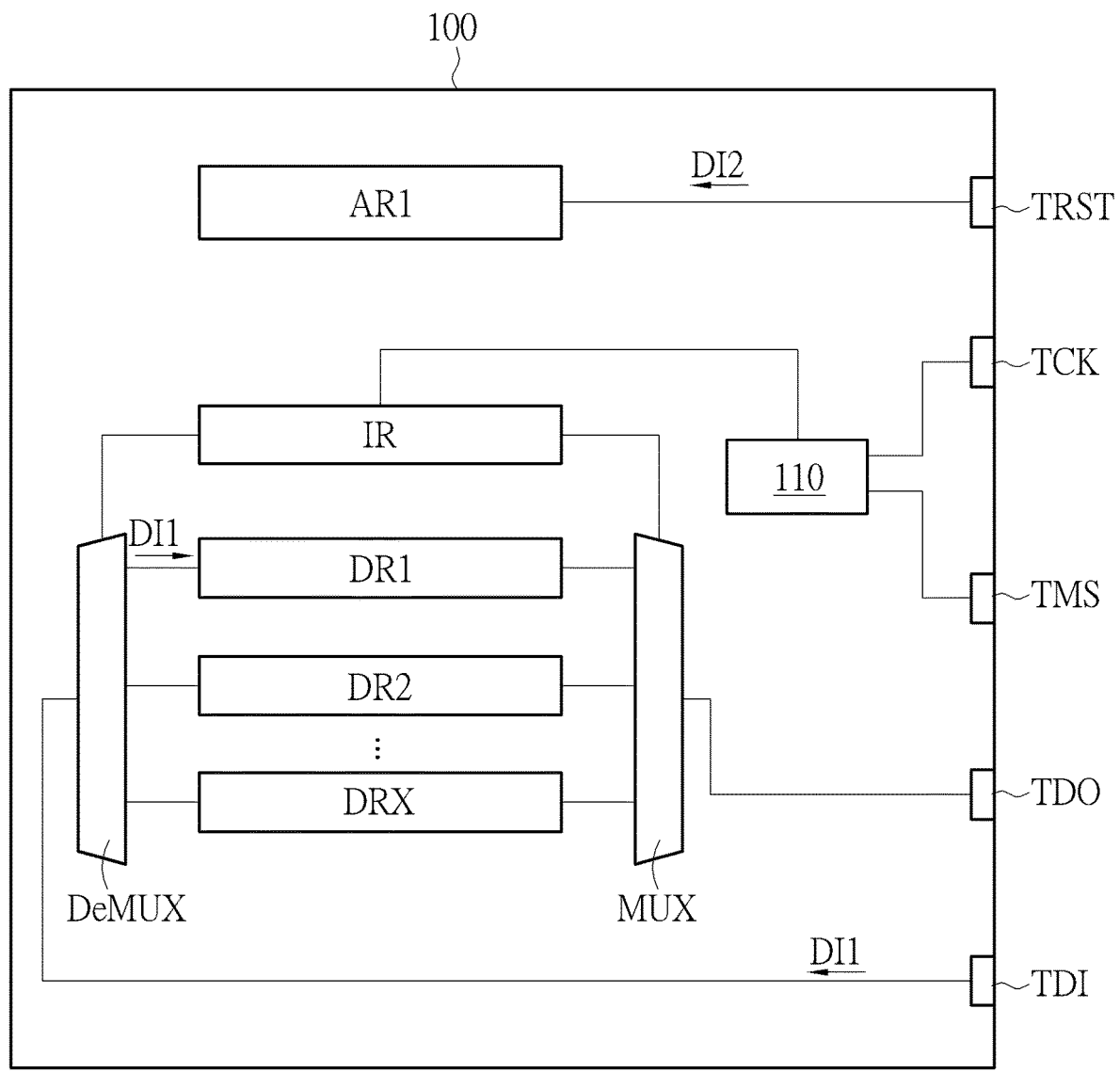
FIG. 1 shows a test access port circuit according to one embodiment of the present invention.

FIG. 1 shows a test access port (TAP) circuit 100 according to one embodiment of the present invention. The TAP circuit 100 can be applied to the joint test action group (JTAG), and can be coupled to the circuit or the device, such as the memory system, to be tested in the system so the data of the circuit or the device to be tested can be captured or outputted for testing and debugging.

In FIG. 1, the TAP circuit 100 includes a data input terminal TDI, a data output terminal TDO, a clock signal terminal TCK, a reset terminal TRST, a mode selection terminal TMS, a plurality of test data register sets DR1 to DRX, an auxiliary data register set AR1, an instruction register set IR, and a controller 110, where X is a positive integer.

The controller 110 is coupled to the clock signal terminal TCK, the mode selection terminal TMS, and the instruction register set IR. The controller 110 can identify the mode selection signals received by the mode selection terminal TMS according to the clock signals received by the clock signal terminal TCK, and can control the test data register sets DR1 to DRX, the auxiliary data register set AR1, and the instruction register set IR according to the mode selection signals. In some embodiments, each of the test data register sets DR1 to DRX, the auxiliary data register set AR1, and the instruction register set IR can include a plurality of shift registers coupled in series, so the controller 110 can write data to or read data from the test data register sets DR1 to DRX, the auxiliary data register set AR1, and the instruction register set IR by performing shift operations.

Generally, in the TAP circuit applied to JTAG, the controller 110 can include a finite state machine (FSM). The finite state machine can include a plurality of preset states and can be switched between different states according to the mode selection signals. The preset states of the finite state machine usually includes states such as resetting, idling, configuring the instruction register set, and configuring the test data register sets. In this case, the controller 110 may first perform capture operations and shift operations to write a specific value to the instruction register set IR for selecting the correspondent test data register set. For example, in FIG. 1, the demultiplexer DeMUX and the multiplexer MUX can form electrical paths corresponding to the values stored in the instruction register set IR so the capture operations and the shift operations can be performed on the desired test data register set later on. For example, if the test data register sets DR1 to DRX and the auxiliary data register set AR1 are total 32 data register sets, then the instruction register set IR may store 5 bits of data to represent 32 values corresponding to different data register sets. However, in some other embodiments, the instruction register set IR can include more or less registers according to the system requirement.

In prior art, the TAP circuit 100 can receive data through the data input terminal TDI, and output data through the data output terminal TDO. Since, the data is inputted and outputted one bit at a time, the throughput of the transmission is rather low. In addition, in some embodiments, since the controller 110 can be reset by continuously sending a high-voltage mode selection signal (for example, the mode selection signal TMS is lasted for at least five clock signal TCK), the users can make an agreement to reset the controller 110 by only sending the corresponding mode selection signal instead of sending reset signal through the reset terminal TRST during the communication of JTAG. In this case, the TAP circuit 100 can not only receive the data through the data input terminal TDI, but also receive data through the reset terminal TRST, thereby increasing the transmission throughput.

For example, in the reset terminal input mode, when the controller 110 controls the test data register set DR1 to store the input data bit DI1 received by the data input terminal TDI, the auxiliary data register set AR1 can also store the input data bit DI2 received by the reset terminal TRST in parallel. That is, when the controller 100 selects the test data register set DR1 by writing the correspondent value to the instruction register set IR for receiving the data received by the data input terminal TDI, the auxiliary data register set AR1 can also receive the data received by the reset terminal TRST. Consequently, the throughput of the controller for receiving data can be doubled. That is, the TAP circuit 100 can preset the relation between the test data register set DR1 and the auxiliary data register set AR1, and receive data through the data input terminal TDI and the reset terminal TRST in parallel.

In some embodiments, the storage spaces of the test data register set DR1 and the auxiliary data register set AR1 can have the same size, for example, the test data register set DR1 and the auxiliary data register set AR1 can include the same number of shift registers, so the two data register sets can receive the data transmitted by the master applied in the JTAG in parallel, and can be shifted simultaneously. However, in some other embodiments, the test data register set DR1 and the auxiliary data register set AR1 can have storage spaces of different sizes. For example, the storage size of the auxiliary data register set AR1 can be smaller than the storage size of the test data register set DR1. In this case, the TAP circuit 100 may require some other logic circuits to stop the auxiliary data register set AR1 from continuously shifting when the auxiliary data register set AR1 is full while the test data register set DR1 is not. In another embodiment, the data received by the data input terminal TDI and the reset terminal TRST can have the same length. However, the controller 110 can store the valid data to the least significant bit, and fill the redundant data to the most significant bit for the auxiliary data register set AR1. Therefore, if the data is transmitted from the most significant bit, the data stored in the auxiliary data register set AR1 in the end will still be the data required, since the redundant bits are shifted out by end of the transmission.

Figure 2:
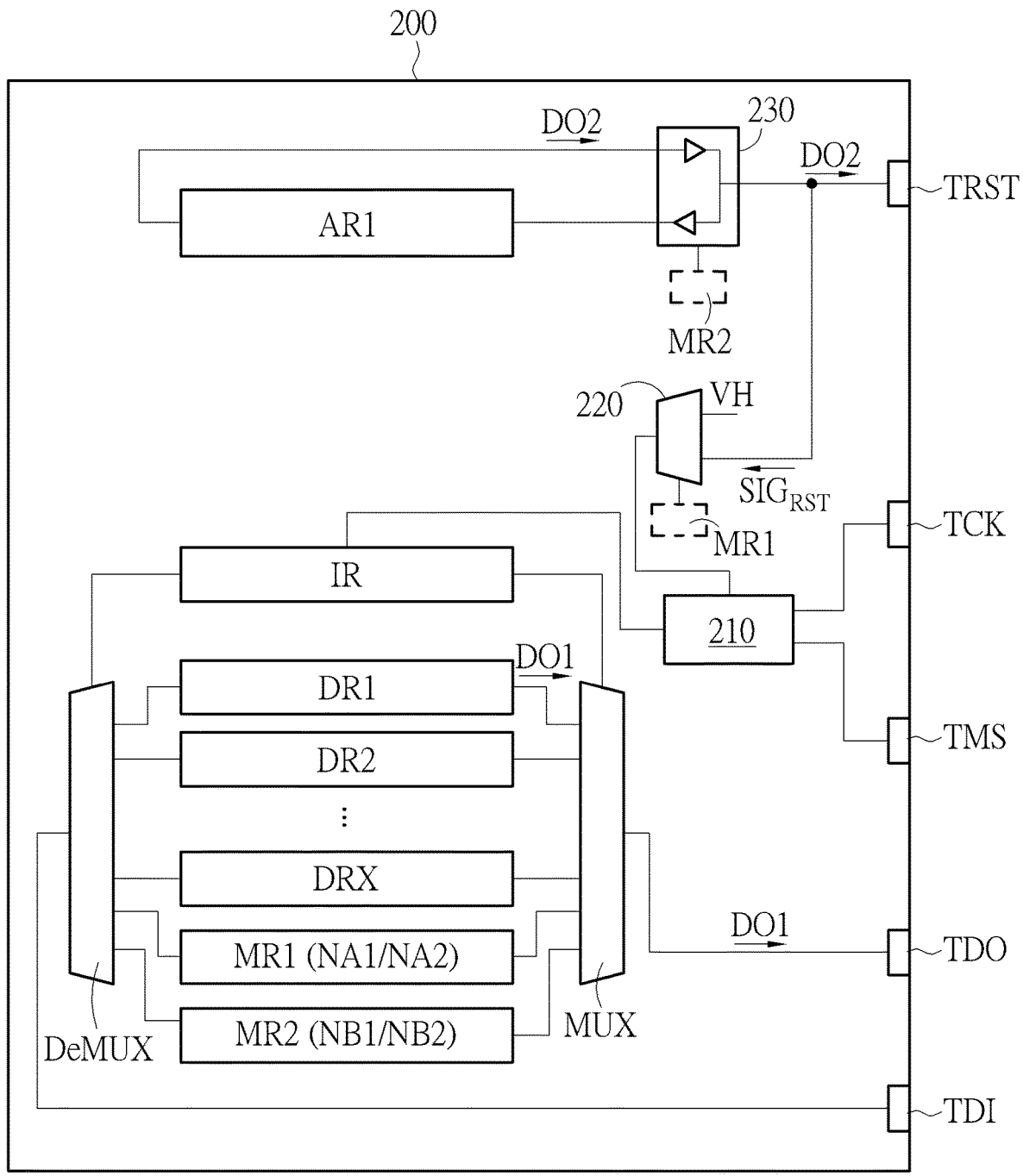
FIG. 2 shows a test access port circuit according to another embodiment of the present invention.

FIG. 2 shows a TAP circuit 200 according to one embodiment of the present invention. The TAP circuit 200 and the TAP circuit 100 have similar structures and can be operated with similar principles. However, the TAP circuit 200 can also support the external reset mode and the reset terminal output mode. That is, the TAP circuit 200 reserves the function of performing the reset operation to the controller 210 by sensing the reset signal to the reset terminal TRST, and also includes the function of receiving or outputting data through the reset terminal TRST.

In FIG. 2, the TAP circuit 200 can include a path selection circuit 220 and a mode register set MR1. The path selection circuit 220 has a first input terminal coupled to the reset terminal TRST, a second input terminal for receiving a predetermined voltage VH, and an output terminal for outputting a reset signal $SIG_{RST}$ or the predetermined voltage VH to the controller 210. In some embodiments, the path selection circuit 220 can be implemented by a multiplexer, and the mode register set MR1 can be coupled to the control terminal of the path selection circuit 220. In some embodiments, if the reset operation to the controller 210 is triggered when the reset signal $SIG_{RST}$ is at a low voltage, the predetermined voltage VH would be set to a high voltage for preventing the controller 210 from being reset. For example, in FIG. 2, the predetermined voltage VH can be set to a high voltage representing logic 1. However, if the mode selection terminal TMS of the TAP circuit 200 receives a high-voltage mode selection signal continuously, the controller 210 will still be reset.

In some embodiments, the master of the JTAG can output a series of mode selection signals to the controller 210 so the finite state machine of the controller 210 can select the mode register set MR1 by writing a correspondent value to the instruction register set IR, and write a value NA1 to the mode register set MR1. The value NA1 can be, for example but not limited to, 0. In this case, the path selection circuit 220 will form an electrical connection between its first input terminal (that is, the reset terminal TRST) and output terminal so that the TAP circuit 200 will enter the external reset mode, and the TAP circuit 200 can receive the reset signal $SIG_{RST}$ transmitted through the reset terminal TRST. However, if the controller 210 writes a value NA2, for example but not limited to 1, to the mode register set MR1, the path selection circuit 220 will form an electrical connection between its second input terminal (that is the predetermined voltage VH) and output terminal so that the controller 210 will keep receiving the high voltage signal and will not be reset by the voltage received by the reset terminal TRST, and the controller 210 can enter the reset terminal input mode or the reset terminal output mode.

In FIG. 2, the TAP circuit 200 can receive data and output data through the reset terminal TRST. For example, in the reset terminal output mode, when the controller 210 controls the test data register set DR1 to output an output data bit DO1 through the data output terminal TDO, the auxiliary data register set AR1 can also output an output data bit DO2 through the reset terminal TRST in parallel. Consequently, the output throughput of the TAP circuit 200 can be increased.

To support both the reset terminal output mode and the reset terminal input mode, the TAP circuit 200 can further include a bi-directional signal selection circuit 230 and a mode register set MR2. The bi-directional signal selection circuit 230 can be coupled to the auxiliary data register set AR1 and the reset terminal TRST, and the mode register set MR2 can be coupled to the bi-directional signal selection circuit 230.

In this case, the controller 210 can select the mode register set MR2 through the instruction register set IR, and write a value NB1 to the mode register set MR2 so as to have the TAP circuit 200 enter the reset terminal input mode and control the bi-directional signal selection circuit 230 to receive input data bit DI2 through the reset terminal TRST (not shown in FIG. 2). In contrast, when the controller 210 writes a value NB2 different from the value NB1 in the mode register set MR2, the TAP circuit 200 can enter the reset terminal output mode, and the bi-directional signal selection circuit 230 will output the output data bit DO2 through the reset terminal TRST.

Since the TAP circuit 200 can control the newly added mode register sets MR1 and MR2 through the instruction register set IR and control the internal signal path accordingly, the TAP circuit 200 is able to support the reset terminal output mode, the reset terminal input mode, and the external reset mode to increase the throughput for both output transmission and input transmission without changing the finite state machine of the controller 210.

Figure 3:
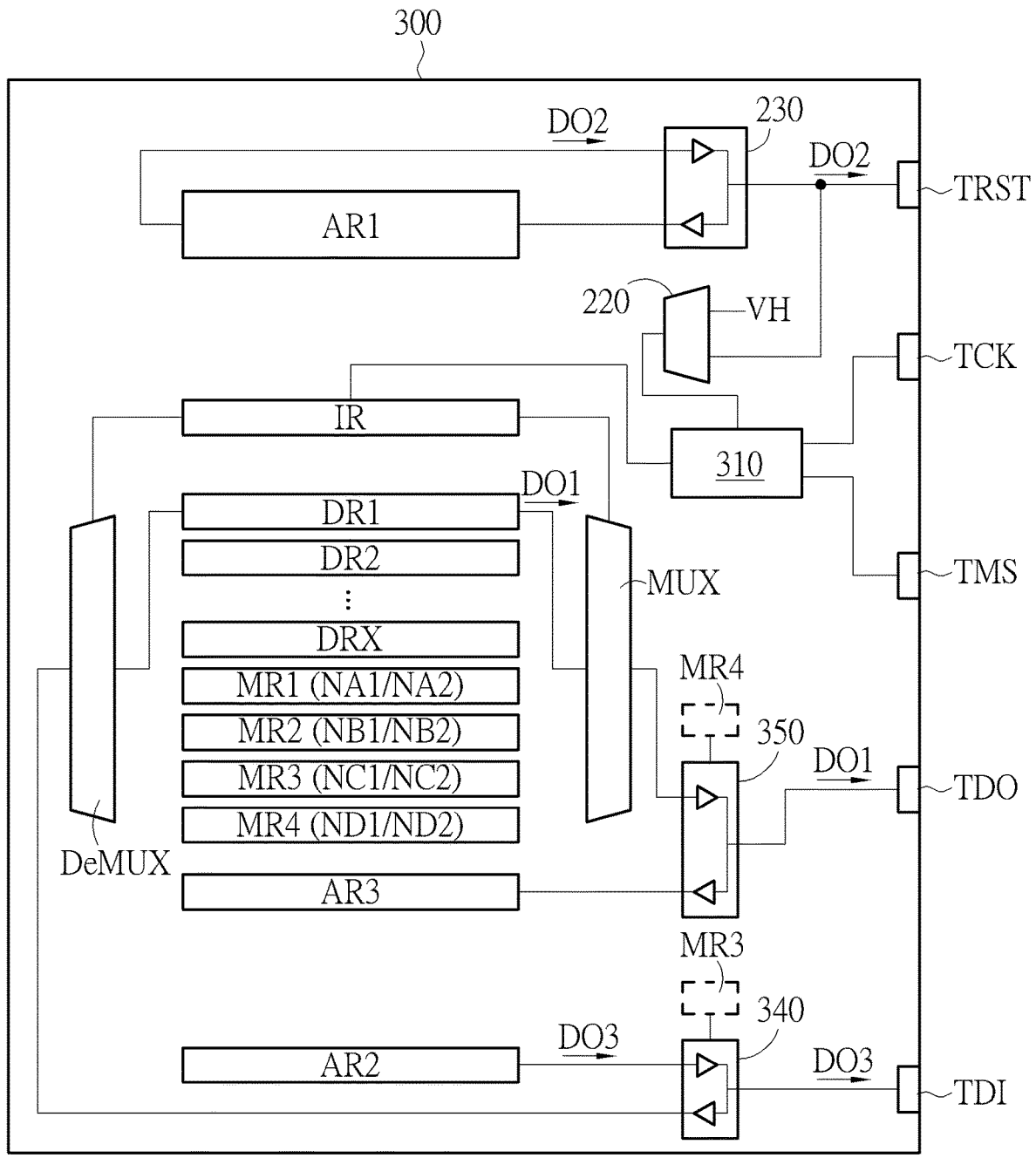
FIG. 3 shows a test access port circuit according to another embodiment of the present invention.

FIG. 3 shows a TAP circuit 300 according to one embodiment of the present invention. The TAP circuit 300 and the TAP circuit 200 have similar structures and can be operated with similar principles. However, the TAP circuit 300 can further support the input terminal output mode and the output terminal input mode. That is, the TAP circuit 300 can not only receive and output data through the reset terminal TRST, but also output data through the data input terminal TDI and receive data through the data output terminal TDO. Therefore, the throughput for receiving data and outputting data can both be further increased.

In FIG. 3, the TAP circuit 300 can include an auxiliary data register set AR2. In the data input terminal input mode, the data input terminal TDI can be used for receiving data, and the controller 310 can select one of the test data register sets DR1 to DRX to store the input data bits received by the data input terminal TDI. In contrast, in the data input terminal output mode, the data input terminal TDI can be used for outputting data. For example, when the controller 310 controls the test data register set DR1 to output the output data bit DO1 through the data output terminal TDO, the auxiliary data register set AR2 can also output the output data bit DO3 through the data input terminal TDI in parallel. That is, the TAP circuit 300 can preset the relation between the test data register set DR1 and the auxiliary data register set AR2, and output data from both data register sets in parallel. Consequently, the TAP circuit 300 can output the data bits in the test data register set DR1 through the data output terminal TDO and the output the data bits in the auxiliary data register set AR2 through the data input terminal TDI simultaneously, thereby increasing the throughput of output transmission.

In some embodiments, the reset terminal output mode and the data input terminal output mode can be activated at the same time. In this case, the TAP circuit 300 can output the output data bits DO1, DO2, and DO3 stored in the test data register set DR1, the auxiliary data register set AR1, and the auxiliary data register set AR2 through the data output terminal TDO, the reset terminal TRST, and the data input terminal TDI at the same time, therefore the throughput of output transmission can be increased threefold compared with the prior art.

However, the present invention does not limit to presetting the relation between the test data register set DR1 and the auxiliary data register set AR2. For example, in some embodiments, the TAP circuit 300 can also preset the relation between the test data register set DR2 and the auxiliary data register set AR2. In this case, in the data input terminal output mode, when the controller 310 selects the test data register set DR2 to output the output data bit through the data output terminal TDO, the auxiliary data register set AR2 will also output the output data bit through the data input terminal TDI in parallel.

In FIG. 3, the TAP circuit 300 can further include a bi-directional signal selection circuit 340 and a mode register set MR3. The bi-directional signal selection circuit 340 can be coupled to the auxiliary data register set AR2 and the data input terminal TDI, and the mode register set MR3 can be coupled to the bi-directional signal selection circuit 340. In some embodiments, the controller 310 can write a value NC1 to the mode register set MR3 to control the bi-directional signal selection circuit 340 to receive the data input bit through the data input terminal TDI, and have the TAP circuit 300 enter the data input terminal input mode. In contrast, if the controller 310 writes a value NC2 different from the value NC1 to the mode register set MR3, the bi-directional signal selection circuit 340 can be controlled to output the data input bit through the data input terminal TDI, for example, to output the output data bit DO3 stored in the auxiliary data register set AR2. In this case, the TAP circuit 300 is operated in the data input terminal output mode.

Figure 4:
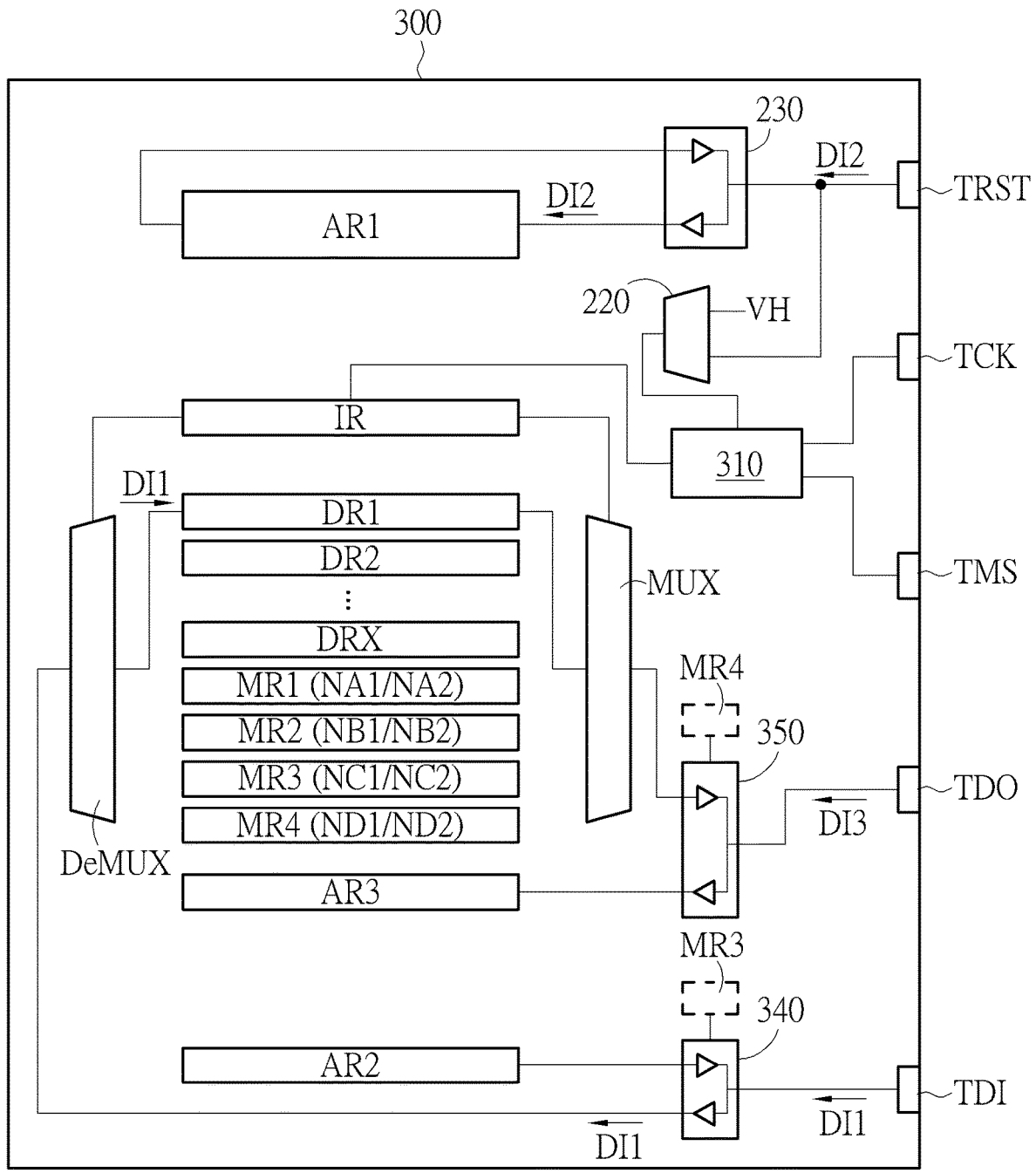
FIG. 4 shows the test access port circuit of FIG. 3 in the data output terminal input mode.

In addition, the TAP circuit 300 can also receive data through the data output terminal TDO. FIG. 4 shows the TAP circuit 300 in the data output terminal input mode. The TAP circuit 300 includes an auxiliary data register set AR3. In the data output terminal output mode, the data output terminal TDO can be used to output data, and the controller 310 can select one of the test data register sets DR1 to DRX, and output the data bits stored in the selected test data register set through the data output terminal TDO. However, in the data output terminal input mode shown in FIG. 4, the data output terminal TDO can be used to receive data. For example, when the controller 310 controls the test data register set DR1 to receive the input data bit DI1 through the data input terminal TDI, the auxiliary data register set AR3 can also receive input data bit DI3 through the data output terminal TDO in parallel. That is, the TAP circuit 300 can preset the relation between the test data register set DR1 and the auxiliary data register set AR3, so the two data register sets DR1 and AR3 can receive data in parallel. Consequently, the TAP circuit 300 can store the data bits received by the data input terminal TDI to the test data register set DR1 and store the data bits received by the data output terminal TDO to the auxiliary data register set AR3 simultaneously, thereby increasing the throughput of input transmission.

In some embodiments, the reset terminal input mode and the data output terminal input mode can be activated at the same time. In this case, the TAP circuit 300 can store the input data bits DI1, DI2, and DI3 received by the data input terminal TDI, the reset terminal TRST, and the data output terminal TDO to the test data register set DR1, the auxiliary data register set AR1, and the auxiliary data register set AR3 at the same time respectively, therefore the throughput of input transmission can be increased threefold compared with the prior art.

However, the present invention does not limit to presetting the relation between the test data register set DR1 and the auxiliary data register set AR3. For example, in some embodiments, the TAP circuit 300 can also preset the relation between the test data register set DR2 and the auxiliary data register set AR3. In this case, in the data output terminal input mode, when the controller 310 selects to store the data input bits received by the data input terminal TDI to the test data register set DR2, the auxiliary data register set AR3 can also receive the input data bits through the data output terminal TDO in parallel.

In FIG. 4, the TAP circuit 300 can further include a bi-directional signal selection circuit 350 and the mode register set MR4. The bi-directional signal selection circuit 350 is coupled to the auxiliary data register set AR3 and the data output terminal TDO, and the mode register set MR4 can be coupled to the bi-directional signal selection circuit 350. In some embodiments, the controller 310 can write a value ND1 to the mode register set MR4 to control the bi-directional signal selection circuit 350 to output the output data bit through the data output terminal TDO, and have the TAP circuit 300 enter the data output terminal output mode. However, if the controller 310 writes a value ND2 different from the value ND1 to the mode register set MR4, the bi-directional signal selection circuit 350 would be controlled to receive the input data bit (e.g., the input data bit DI3) through the data output terminal TDO, the TAP circuit 300 would enter the data output terminal input mode.

In some embodiments, the TAP circuit 300 can receive data or output data through the reset terminal TRST, the data input terminal TDI, and the data output terminal TDO, so that the throughput for input and output transmission can be improved. However, in some embodiments, according to the system requirement, the TAP circuit can support the data input terminal output mode without supporting the reset terminal input mode, the reset terminal output mode, and/or the data output terminal input mode, or can support the data output terminal input mode without supporting the reset terminal input mode, the reset terminal output mode, and/or the data input terminal output mode. That is, according to the actual requirement, the designer can omit one or two of the auxiliary data register sets AR1, AR2, and AR3 in the TAP circuit 300 and the correspondent bi-directional signal selection circuits and mode register sets, and only preserve the auxiliary data register set and the correspondent bi-directional signal selection circuit and the mode register set in use.

In summary, the TAP circuits provided by the embodiments of the present invention can receive and output data through the reset terminal, the data input terminal and the data output terminal in parallel, thereby increasing the throughput of both input transmission and output transmission. In addition, the TAP circuits provided by the embodiments of the present invention can control the mode register sets by using the instruction register set, and control the internal signal paths with the mode register sets; therefore, there is no need to redesign the finite state machine of the controller, allowing the TAP circuit to be designed with better flexibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test access port circuit comprising:
   a data input terminal;
   a reset terminal;
   a mode selection terminal;
   at least one test data register set;
   a first auxiliary data register set;
   an instruction register set; and
   a controller coupled to the mode selection terminal and the instruction register set, and configured to control the at least one test data register set, the first auxiliary data register set, and the instruction register set according to at least mode selection signal received by the mode selection terminal;
   wherein:
   in a reset terminal input mode, when the controller controls a first test data register set of the at least one test data register set to store a first input data bit received by the data input terminal, the first auxiliary data register set stores a second input data bit received by the reset terminal.

2. The test access port circuit of claim 1, wherein:
   in an external reset mode, the controller resets the controller according to a reset signal received by the reset terminal.

3. The test access port circuit of claim 2, further comprising:
   a path selection circuit having a first input terminal coupled to the reset terminal, a second input terminal configured to receive a predetermined voltage, and an output terminal configured to output the reset signal or the predetermined voltage to the controller, and a control terminal; and
   a first mode register set coupled to the controller and the control terminal of the path selection circuit;
   wherein:
   the controller is further configured to write a first value to the first mode register set to have the path selection circuit form an electrical connection between the first input terminal and the output terminal of the path selection circuit so as to have the test access port circuit enter the external reset mode; and
   the controller is further configured to write a second value to the first mode register set to have the path selection circuit form an electrical connection between the second input terminal and the output terminal of the path selection circuit so as to have the test access port circuit enter the reset terminal input mode.

4. The test access port circuit of claim 3, wherein the controller comprises a finite state machine (FSM) configured to write a predetermined value to the instruction register set to select the first mode register set and write the first value or the second value to the first mode register set according to the at least one mode selection signal.

5. The test access port circuit of claim 1, wherein:
   in a reset terminal output mode, when the controller controls the first test data register set to output a first output data bit through a data output terminal of the test access port circuit, the first auxiliary data register set outputs a second output data bit through the reset terminal.

6. The test access port circuit of claim 5, further comprising:
a first bi-directional signal selection circuit coupled to the first auxiliary data register set and the reset terminal; and
a second mode register set coupled to the first bi-directional signal selection circuit;
wherein:
the controller is further configured to write a first value to the second mode register set so as to have the test access port circuit enter the reset terminal input mode, and control the first bi-directional signal selection circuit to receive the second input data bit through the reset terminal; and
the controller is further configured to write a second value to the second mode register set so as to have the test access port circuit enter the reset terminal output mode, and control the first bi-directional signal selection circuit to output the second input data bit through the reset terminal.

7. The test access port circuit of claim 1, further comprising:
a second auxiliary data register set;
wherein:
in a data input terminal input mode, the controller controls a test data register set of the at least one test data register set to receive a third input data bit through the data input terminal; and
in a data input terminal output mode, when the controller controls a second test data register set of the at least one test data register set to output a third output data bit through a data output terminal of the test access port circuit or controls the first test data register set to output a first output data bit through the data output terminal, the second auxiliary data register set outputs a fourth output data bit through the data input terminal.

8. The test access port circuit of claim 7, further comprising:
a second bi-directional signal selection circuit coupled to the second auxiliary data register set and the data input terminal; and
a third mode register set coupled to the second bi-directional signal selection circuit;
wherein:
the controller is further configured to write a first value to the third mode register set so as to have the test access port circuit enter the data input terminal input mode, and control the second bi-directional signal selection circuit to receive the third input data bit through the data input terminal; and
the controller is further configured to write a second value to the third mode register set so as to have the test access port circuit enter the data input terminal output mode, and control the second bi-directional signal selection circuit to output the fourth output data bit through the data input terminal.

9. The test access port circuit of claim 1, further comprising:
a third auxiliary data register set;
wherein:
in a data output terminal output mode, the controller controls a test data register set of the at least one test data register set to output a third output data bit through a data output terminal of the test access port circuit; and
in a data output terminal input mode, when the controller controls a second test data register set of the at least one test data register set to receive a third input data bit through the data input terminal or controls the first test data register set to receive the first input data bit through the data input terminal, the third auxiliary data register set receives a fourth input data bit through the data output terminal.

10. The test access port circuit of claim 9, further comprising:
a third bi-directional signal selection circuit coupled to the third auxiliary data register set and the data output terminal; and
a fourth mode register set coupled to the third bi-directional signal selection circuit;
wherein:
the controller is further configured to write a first value to the fourth mode register set so as to have the test access port circuit enter the data output terminal output mode, and control the third bi-directional signal selection circuit to output the third output data bit through the data output terminal; and
the controller is further configured to write a second value to the fourth mode register set so as to have the test access port circuit enter the data output terminal input mode, and control the third bi-directional signal selection circuit to receive the fourth input data bit through the data output terminal.

11. The test access port circuit of claim 1, wherein each test data register set of the at least one test data register set comprises a plurality of shift registers coupled in series.

12. A test access port circuit comprising:
a data input terminal;
a data output terminal;
a reset terminal;
a mode selection terminal;
at least one test data register set;
a first auxiliary data register set;
an instruction register set; and
a controller coupled to the mode selection terminal and the instruction register set, and configured to control the at least one test data register set, the first auxiliary data register set, and the instruction register set according to at least mode selection signal received by the mode selection terminal;
wherein:
in a data input terminal input mode, the controller controls a first test data register set of the at least one test data register set to receive a first input data bit through the data input terminal; and
in a data input terminal output mode, when the controller controls the first test data register set of the at least one test data register set to output a first output data bit through the data output terminal, the first auxiliary data register set outputs a second output data bit through the data input terminal.

13. The test access port circuit of claim 12, further comprising:
a first bi-directional signal selection circuit coupled to the first auxiliary data register set and the data input terminal; and
a first mode register set coupled to the first bi-directional signal selection circuit;
wherein:
the controller is further configured to write a first value to the first mode register set so as to have the test access port circuit enter the data input terminal input mode, and control the first bi-directional signal selection circuit to receive the first input data bit through the data input terminal; and the controller is further configured to write a second value to the first mode register set so as to have the test access port circuit enter the data input terminal output mode, and control the first bi-directional signal selection circuit to output the second output data bit through the data input terminal.

14. The test access port circuit of claim 13, wherein the controller comprises a finite state machine (FSM) configured to write a predetermined value to the instruction register set to select the first mode register set and write the first value or the second value to the first mode register set according to the at least one mode selection signal.

15. The test access port circuit of claim 13, further comprising:

a second auxiliary data register set;

wherein:

in a data output terminal output mode, the controller controls a test data register set of the at least one test data register set to output a third output data bit through the data output terminal; and in a data output terminal input mode, when the controller controls a second test data register set of the at least one test data register set to receive a second input data bit through the data input terminal or controls the first test data register set to receive the first input data bit through the data input terminal, the second auxiliary data register set receives a third input data bit through the data output terminal.

16. The test access port circuit of claim 15, further comprising:

a second bi-directional signal selection circuit coupled to the second auxiliary data register set and the data output terminal; and a second mode register set coupled to the second bi-directional signal selection circuit;

wherein:

the controller is further configured to write a first value to the second mode register set so as to have the test access port circuit enter the data output terminal output mode, and control the second bi-directional signal selection circuit to output the third output data bit through the data output terminal; and the controller is further configured to write a second value to the second mode register set so as to have the test access port circuit enter the data output terminal input mode, and control the second bi-directional signal selection circuit to receive the third input data bit through the data output terminal.

17. The test access port circuit of claim 12, wherein each test data register set of the at least one test data register set comprises a plurality of shift registers coupled in series.

18. A test access port circuit comprising:

a data input terminal;

a data output terminal;

a reset terminal;

a mode selection terminal;

at least one test data register set;

a first auxiliary data register set;

an instruction register set; and a controller coupled to the mode selection terminal and the instruction register set, and configured to control the at least one test data register set, the first auxiliary data register set, and the instruction register set according to at least mode selection signal received by the mode selection terminal;

wherein:

in a data output terminal output mode, the controller controls a first test data register set of the at least one test data register set to output a first output data bit through the data output terminal; and in a data output terminal input mode, when the controller controls the first test data register set to receive a first input data bit through the data input terminal, the first auxiliary data register set receives a second input data bit through the data output terminal.

19. The test access port circuit of claim 18, further comprising:

a first bi-directional signal selection circuit coupled to the first auxiliary data register set and the data output terminal; and a first mode register set coupled to the first bi-directional signal selection circuit;

wherein:

the controller is further configured to write a first value to the first mode register set so as to have the test access port circuit enter the data output terminal output mode, and control the first bi-directional signal selection circuit to output the first output data bit through the data output terminal; and the controller is further configured to write a second value to the first mode register set so as to have the test access port circuit enter the data output terminal input mode, and control the first bi-directional signal selection circuit to receive the second input data bit through the data output terminal.

20. The test access port circuit of claim 19, wherein the controller comprises a finite state machine (FSM) configured to write a predetermined value to the instruction register set to select the first mode register set and write the first value or the second value to the first mode register set according to the at least one mode selection signal.

* * * * *